US007764493B2

(12) United States Patent
Ali et al.

(10) Patent No.: US 7,764,493 B2
(45) Date of Patent: Jul. 27, 2010

(54) SYSTEMS AND METHODS FOR COOLING ELECTRONIC DEVICES USING AIRFLOW DIVIDERS

(75) Inventors: Ihab A. Ali, Santa Clara, CA (US); Dinesh Mathew, Fremont, CA (US); Thomas W. Wilson, Jr., Saratoga, CA (US); Keith Hendren, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 12/238,382

(22) Filed: Sep. 25, 2008

(65) Prior Publication Data

US 2009/0175003 A1  Jul. 9, 2009

Related U.S. Application Data

(60) Provisional application No. 61/010,175, filed on Jan. 4, 2008, provisional application No. 61/010,887, filed on Jan. 11, 2008.

(51) Int. Cl.
*G06F 1/20* (2006.01)
*H05K 7/20* (2006.01)

(52) U.S. Cl. .............................. 361/679.51; 361/679.48; 361/679.5; 361/694; 361/695; 174/16.1; 454/184

(58) Field of Classification Search . 361/679.46–679.5, 361/679.54–679.55, 694–695, 704, 719; 165/80.3, 185; 174/16.1, 252
See application file for complete search history.

(56) References Cited

U.S. PATENT DOCUMENTS

| 5,306,571 | A | * | 4/1994 | Dolowy et al. .............. 428/608 |
| 5,483,103 | A | | 1/1996 | Blickhan et al. |
| 5,583,316 | A | | 12/1996 | Kitahara et al. |
| 5,694,294 | A | * | 12/1997 | Ohashi et al. .......... 361/679.48 |
| 5,896,270 | A | | 4/1999 | Tsui |
| 6,049,459 | A | | 4/2000 | Edmonds et al. |
| 6,519,149 | B1 | | 2/2003 | Inoue |
| 6,914,782 | B2 | * | 7/2005 | Ku ............................. 361/700 |
| 7,170,750 | B2 | * | 1/2007 | Tanaka ....................... 361/719 |
| 7,330,354 | B2 | * | 2/2008 | Watanabe ................... 361/705 |
| 7,352,581 | B2 | * | 4/2008 | Tomioka ..................... 361/702 |

(Continued)

FOREIGN PATENT DOCUMENTS

EP  1445683 A2  11/2004

(Continued)

*Primary Examiner*—Jayprakash N Gandhi
*Assistant Examiner*—Robert J Hoffberg
(74) *Attorney, Agent, or Firm*—Kramer Levin Naftalis & Frankel LLP

(57) ABSTRACT

An electronic device can be provided with a heat-generating component and a cooling module for dissipating heat. In some embodiments, the cooling component may include a fan configured to produce an outflow of air, and a divider configured not only to direct a first portion of the outflow between a first surface of the divider and the heat-generating component, but also to direct a second portion of the outflow along a second surface of the divider. In other embodiments, the cooling component may include a divider and a pressure clip. A first portion of the pressure clip may be configured to exert a pressure on a first surface of the divider such that the pressure may hold a portion of a second surface of the divider in contact with the heat-generating component.

17 Claims, 5 Drawing Sheets

U.S. PATENT DOCUMENTS

| | | | |
|---|---|---|---|
| 7,372,697 B2 * | 5/2008 | Tomioka | 361/699 |
| 2005/0196904 A1 * | 9/2005 | Bhattacharya et al. | 438/125 |
| 2006/0126310 A1 * | 6/2006 | Watanabe | 361/720 |
| 2007/0002540 A1 * | 1/2007 | Tomioka | 361/704 |
| 2007/0285890 A1 | 12/2007 | Tsao et al. | |
| 2008/0101038 A1 | 5/2008 | Ali | |

FOREIGN PATENT DOCUMENTS

| | | |
|---|---|---|
| EP | 1536313 A2 | 1/2005 |
| EP | 1739745 A2 | 3/2007 |

\* cited by examiner

SYSTEMS AND METHODS FOR COOLING ELECTRONIC DEVICES USING AIRFLOW DIVIDERS

CROSS-REFERENCE TO RELATED APPLICATIONS

This claims the benefit of U.S. Provisional Patent Application No. 61/010,175, filed Jan. 4, 2008, and U.S. Provisional Patent Application No. 61/010,887, filed Jan. 11, 2008, each of which is hereby incorporated by reference herein in its entirety.

FIELD OF THE INVENTION

This can relate to systems and methods for cooling an electronic device, and, more particularly, to systems and methods for cooling an electronic device using airflow dividers.

BACKGROUND OF THE DISCLOSURE

As electronic components of various electronic devices (e.g., laptop computers) evolve into faster and more dynamic machines, their power requirements often consequently increase. With this increase in power consumption, an increase in power dissipation in the form of heat results. For example, in a laptop computer, chipsets and microprocessors, such as central processing units ("CPUs") and graphics processing units ("GPUs"), are major sources of heat. Heat dissipation is an important consideration in the design of such electronic devices. If this heat is not adequately dissipated, the electronic components may fail and/or cause damage to the electronic device.

Accordingly, what is needed are systems and methods for cooling an electronic device.

SUMMARY OF THE DISCLOSURE

Systems and methods for cooling an electronic device using airflow dividers are provided.

According to some embodiments of the invention, there is provided an electronic device that may include a heat-generating component, a fan configured to produce an outflow of air, and a divider. The divider may be configured to direct a first portion of the outflow of air to flow between a first surface of the divider and the heat-generating component. The divider may also be configured to direct a second portion of the outflow of air to flow along a second surface of the divider.

According to other embodiments of the invention, there is provided an electronic device that may include a heat-generating component, a pressure clip, and a divider having a first surface facing the heat-generating component and a second surface. A portion of the pressure clip may be configured to exert a pressure on a portion of the second surface of the divider. The pressure may be configured to hold a portion of the first surface of the divider in contact with the heat-generating component.

According to yet other embodiments of the invention, there is provided a method of cooling an electronic device having a heat-generating component and a divider with a first surface and a second surface. The method may include exerting a pressure on a portion of the second surface of the divider. The pressure may be configured to hold a portion of the first surface of the divider in contact with the heat-generating component. The method may also include directing a flow of air between the first surface of the divider and the heat-generating component.

BRIEF DESCRIPTION OF THE DRAWINGS

The above and other features of the invention, its nature, and various advantages will become more apparent upon consideration of the following detailed description, taken in conjunction with the accompanying drawings, in which like reference characters refer to like parts throughout, and in which.

DETAILED DESCRIPTION OF THE DISCLOSURE

Systems and methods for cooling an electronic device using airflow dividers are provided and described with reference to FIGS. 1-6C.

Figure 1:
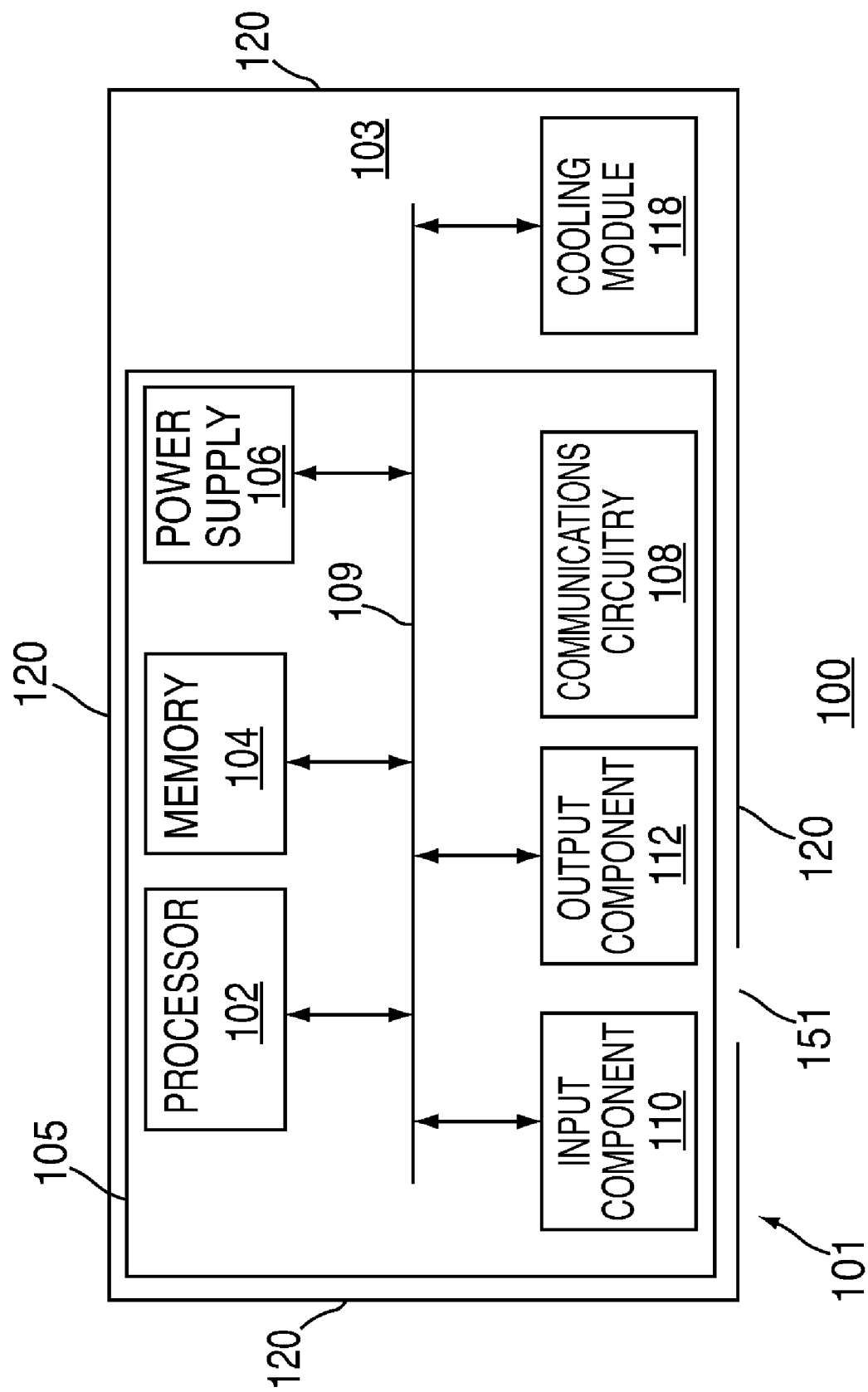
FIG. 1 shows a simplified schematic diagram of an electronic device, according to some embodiments of the invention.

FIG. 1 is a simplified schematic diagram of an electronic device 100 in accordance with some embodiments of the invention. The term "electronic device" can include, but is not limited to, music players, video players, still image players, game players, other media players, music recorders, video recorders, cameras, other media recorders, radios, medical equipment, domestic appliances, transportation vehicle instruments, musical instruments, calculators, cellular telephones, other wireless communication devices, personal digital assistants, remote controls, pagers, computers (e.g., desktops, laptops, tablets, servers, etc.), monitors, televisions, stereo equipment, set up boxes, set-top boxes, boom boxes, modems, routers, keyboards, mice, speakers, printers, and combinations thereof.

As shown in FIG. 1, electronic device 100 may include housing 101, processor 102, memory 104, motherboard 105, power supply 106, communications circuitry 108, bus 109, input component 110, output component 112, and cooling module 118. Bus 109 may include one or more wired or wireless links that provide paths for transmitting data and/or power, to, from, or between various components of electronic device 100 including, for example, processor 102, memory 104, power supply 106, communications circuitry 108, input component 110, output component 112, and cooling module 118.

Memory 104 may include one or more storage mediums, including, but not limited to, a hard-drive, flash memory, permanent memory such as read-only memory ("ROM"), semi-permanent memory such as random access memory ("RAM"), any other suitable type of storage component, and any combinations thereof. Memory 104 may include cache memory, which may be one or more different types of memory used for temporarily storing data for electronic device applications.

Power supply 106 may provide power to the electronic components of electronic device 100. In some embodiments, power supply 106 can be coupled to a power grid (e.g., when device 100 is not a portable device, such as a desktop computer). In some embodiments, power supply 106 can include one or more batteries for providing power (e.g., when device 100 is a portable device, such as a cellular telephone or a laptop computer). As another example, power supply 106 can be configured to generate power from a natural source (e.g., solar power using solar cells).

Communications circuitry 108 may be provided to allow device 100 to communicate with one or more other electronic devices using any suitable communications protocol. For example, communications circuitry 108 may support Wi-Fi™ (e.g., an 802.11 protocol), Ethernet, Bluetooth™, high frequency systems (e.g., 900 MHz, 2.4 GHz, and 5.6 GHz communication systems), infrared, transmission control protocol/internet protocol ("TCP/IP") (e.g., any of the protocols used in each of the TCP/IP layers), hypertext transfer protocol ("HTTP"), BitTorrent™, file transfer protocol ("FTP"), real-time transport protocol ("RTP"), real-time streaming protocol ("RTSP"), secure shell protocol ("SSH"), any other communications protocol, and any combinations thereof. Communications circuitry 108 can also include circuitry that enables device 100 to be electrically coupled to another device (e.g., a computer or an accessory device) and communicate with that other device.

One or more input components 110 may be provided to permit a user to interact or interface with device 100. For example, input component 110 can take a variety of forms, including, but not limited to, an electronic device pad, dial, click wheel, scroll wheel, touch screen, one or more buttons (e.g., a keyboard), mouse, joy stick, track ball, microphone, camera, video recorder, and any combinations thereof. Each input component 110 may be configured to provide one or more dedicated control functions for making selections or issuing commands associated with operating device 100.

One or more output components 112 can be provided to present information (e.g., textual, graphical, audible, and/or tactile information) to a user of device 100. Output component 112 can take a variety of forms, including, but not limited to, audio speakers, headphones, signal line-outs, visual displays, antennas, infrared ports, rumblers, vibrators, and any combinations thereof.

It should be noted that one or more input components 110 and/or one or more output components 112 may sometimes be referred to individually or collectively herein as an input/output ("I/O") component or I/O or user interface. It should also be noted that one or more input components 110 and one or more output components 112 may sometimes be combined to provide a single I/O component or user interface, such as a touch screen that may receive input information through a user's touch of a display screen and that may also provide visual information to a user via that same display screen.

Processor 102 of device 100 may control the operation of many functions and other circuitry provided by device 100. For example, processor 102 can receive input signals from input component 110 and/or drive output signals through output component 112. Processor 102 may load a user interface program (e.g., a program stored in memory 104 or on another device or server) to determine how instructions received via input component 110 may manipulate the way in which information (e.g., information stored in memory 104 or on another device or server) is provided to the user via output component 112.

Motherboard 105 may be a central or primary printed circuit board ("PCB") of electronic device 100, and may also be known as a main circuit board, mainboard, baseboard, system board, planar board, or logic board. Motherboard 105 may provide attachment points for one or more of the other electronic components of electronic device 100 (e.g., processor 102, memory 104, power supply 106, communications circuitry 108, input component 110, any external peripheral devices, etc.). Generally, most of the basic circuitry and components required for electronic device 100 to function may be onboard or coupled (e.g., via a cable) to motherboard 105. Motherboard 105 may include one or more chipsets or specialized groups of integrated circuits. For example, motherboard 105 may include two components or chips, such as a Northbridge and Southbridge. Although in other embodiments, these chips may be combined into a single component.

Housing 101 may at least partially enclose one or more of the various electronic components associated with operating electronic device 100 for protecting them from debris and other degrading forces external to device 100. In some embodiments, housing 101 may include one or more walls 120 that define a cavity 103 within which the various electronic components of device 100 can be disposed. In some embodiments, housing 101 can support various electronic components of device 100, such as I/O component 110 and/or I/O component 112, at the surfaces or within one or more housing openings 151 through the surfaces of walls 120 of housing 101. Housing openings 151 may also allow certain fluids (e.g., air) to be drawn into and discharged from cavity 103 of electronic device 100 for helping to manage the internal temperature of device 100.

In some embodiments, one or more of the electronic components of electronic device 100 may be provided within its own housing component (e.g., input component 110 may be an independent keyboard or mouse within its own housing component that may wirelessly or through a wire communicate with processor 102, which may similarly be provided within its own housing component). Housing 101 can be formed from a wide variety of materials including, but not limited to, metals (e.g., steel, copper, titanium, aluminum, and various metal alloys), ceramics, plastics, and any combinations thereof. Housing 101 may also help to define the shape or form of electronic device 100. That is, the contour of housing 101 may embody the outward physical appearance of electronic device 100.

Heat may be generated by one or more electronic components of electronic device 100, such as a chipset of motherboard 105, processor 102, and/or power supply 106, for example. The heat may increase the temperature of an external surface of the heat-generating electronic component. If this heat is not adequately dissipated, the electronic component may fail and/or cause damage to electronic device 100. Therefore, electronic device 100 may include one or more heat-dissipating or cooling modules 118 that may be positioned adjacent such a heat-generating component in order to transfer the heat generated at the surface of the electronic component away from the electronic component. Each cooling module 118 may include one or more various components according to various embodiments of the invention, including, but not limited to, fans, heat sinks, heat spreaders, heat pipes, pressure clips, thermoelectric cooling components, airflow dividers, and any combinations thereof.

According to some embodiments of the invention, each cooling module 118 may include an airflow generator and an airflow divider. The airflow generator may be configured to produce an outflow of air. The divider may be configured to direct a first portion of the outflow of air to flow between a first surface of the divider and a heat-generating component of the electronic device. Moreover, the divider may be configured to direct a second portion of the outflow of air to flow along a second surface of the divider. According to other embodiments, each cooling module 118 may include a divider and a pressure clip. The divider may include a first surface facing a heat-generating component and a second surface. The pressure clip may be configured to exert a pressure on a portion of the second surface of the divider. The pressure exerted by the pressure clip may be configured to hold a portion of the first surface of the divider in contact with the heat-generating component.

Figure 2:
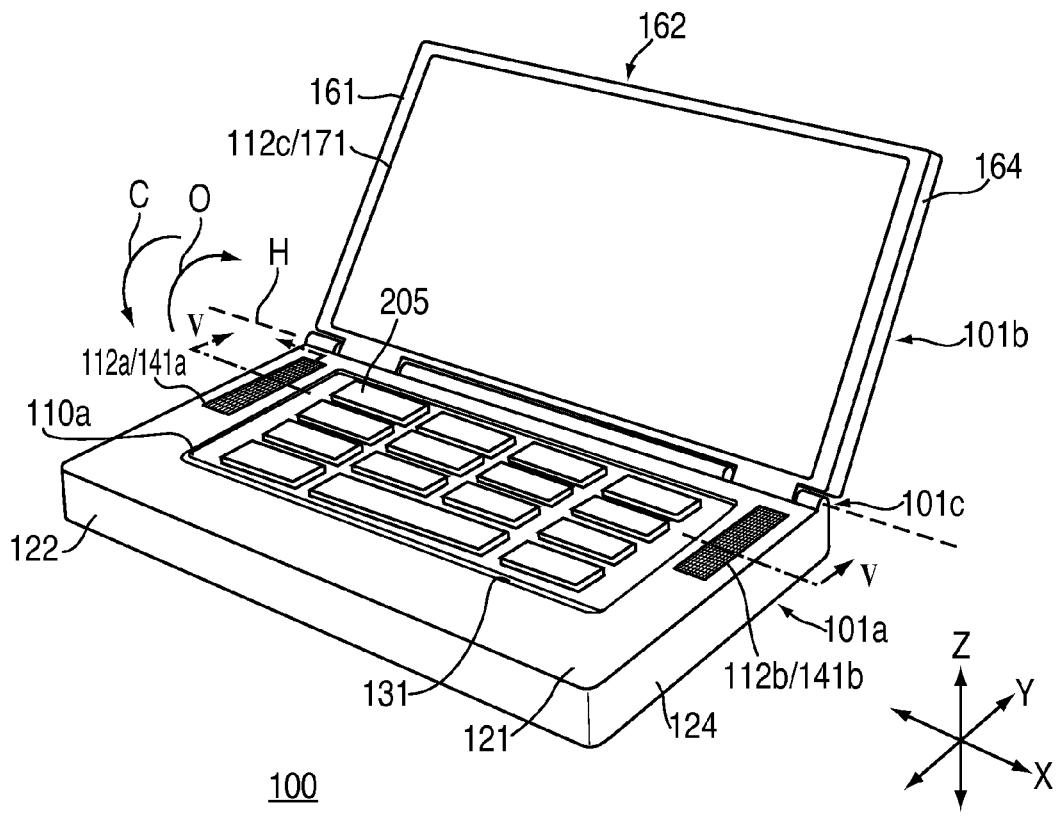
FIG. 2 shows a top, front, right perspective view of the electronic device of FIG. 1 in an open position, according to some embodiments of the invention.
Figure 3:
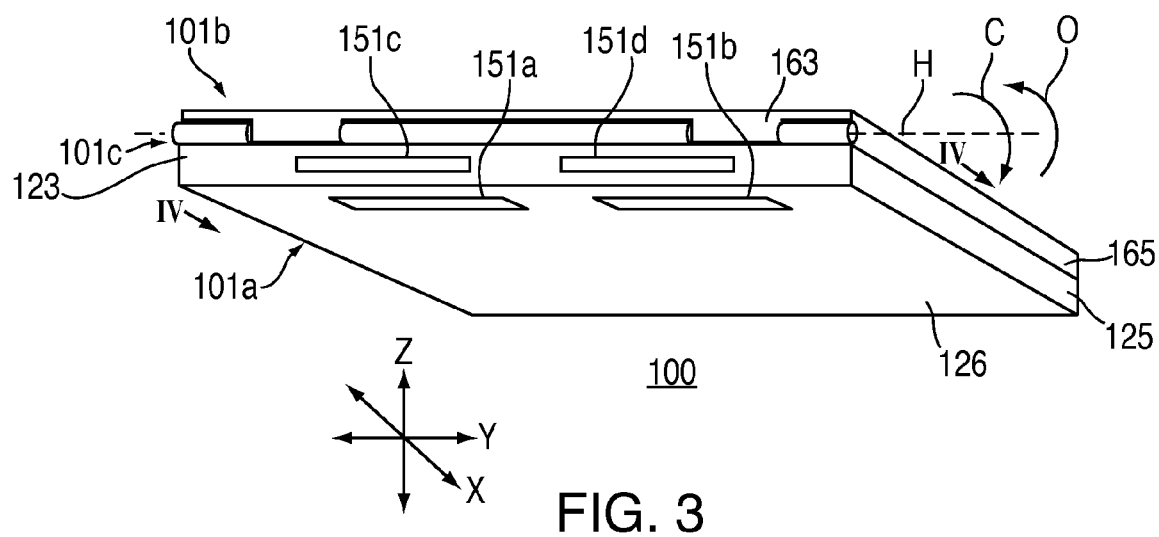
FIG. 3 shows a bottom, back, left perspective view of the electronic device of FIGS. 1 and 2 in a closed position, according to some embodiments of the invention.

Electronic device 100 is illustrated in FIGS. 2-5 to be a laptop computer, although it is to be understood that electronic device 100 may be any type of electronic device as described herein in accordance with the invention. As shown in FIGS. 2 and 3, for example, housing 101 of electronic device 100 may be configured to provide two housing components coupled together by a hinge or clutch assembly. Particularly, housing 101 may include a base housing component 101a and a display housing component 101b coupled to one another by a hinge assembly 101c, also known as clutch assembly 101c. Housing components 101a, 101b, and 101c may be configured such that electronic device 100 may be "opened" for use (see, e.g., FIG. 2) by rotating display housing component 101b away from base housing component 101a in the direction of arrow O about hinge axis H of hinge assembly 101c, and such that electronic device 100 may be "closed" (see, e.g., FIG. 3) by rotating display housing component 101b towards base housing component 101a in the direction of arrow C about hinge axis H. However, it should be noted that housing 101 of device 100 is only exemplary and need not include two substantially hexahedral portions coupled by a hinge. For example, in certain embodiments, the housing of device 100 could generally be formed in any other suitable shape, including, but not limited to, one or more housing components or portions that are substantially spherical, ellipsoidal, conoidal, octahedral, and any combinations thereof.

Figure 4:
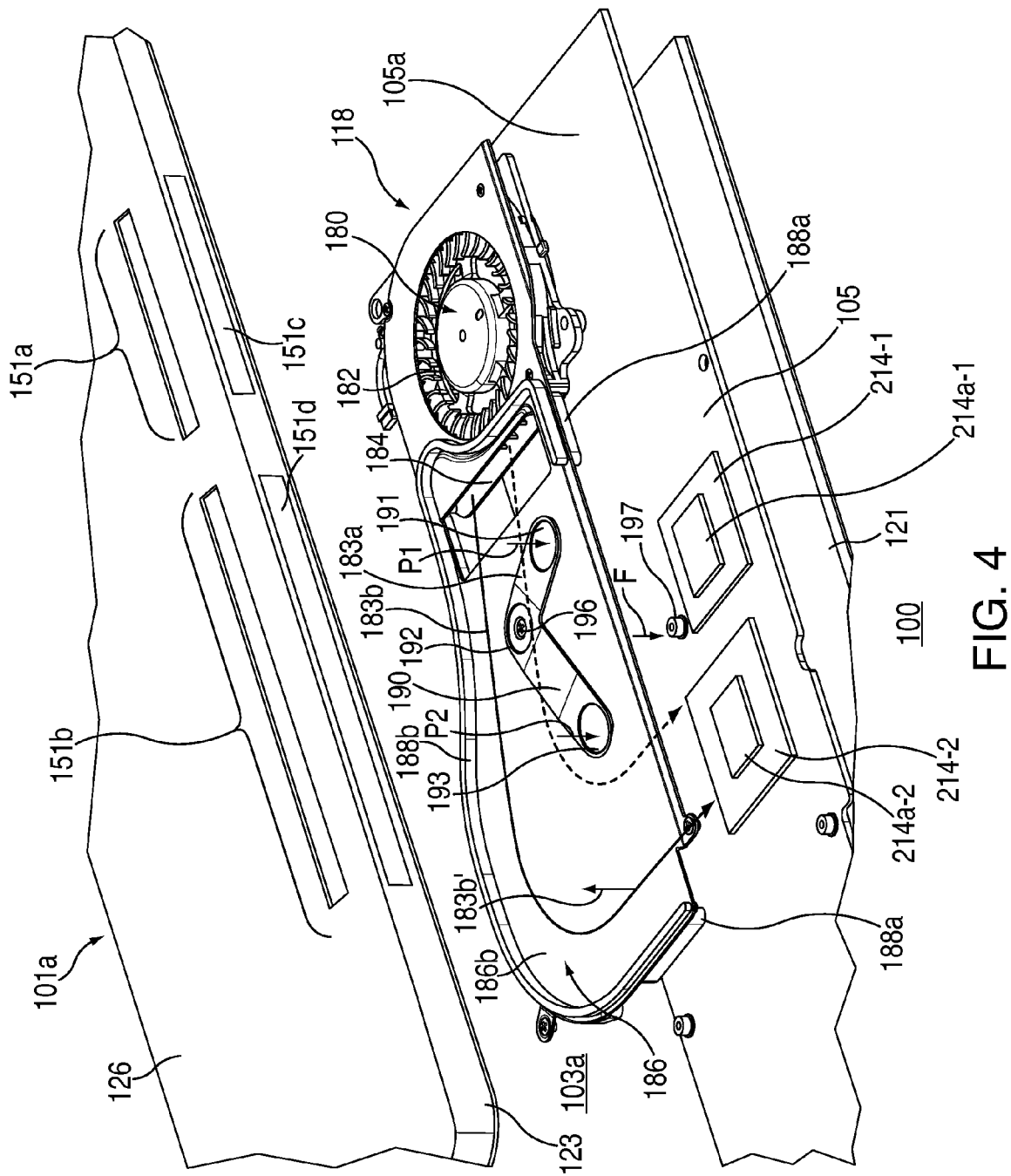
FIG. 4 shows an exploded bottom, rear, right perspective view of a portion of the electronic device of FIGS. 1-3, according to some embodiments of the invention.
Figure 5:
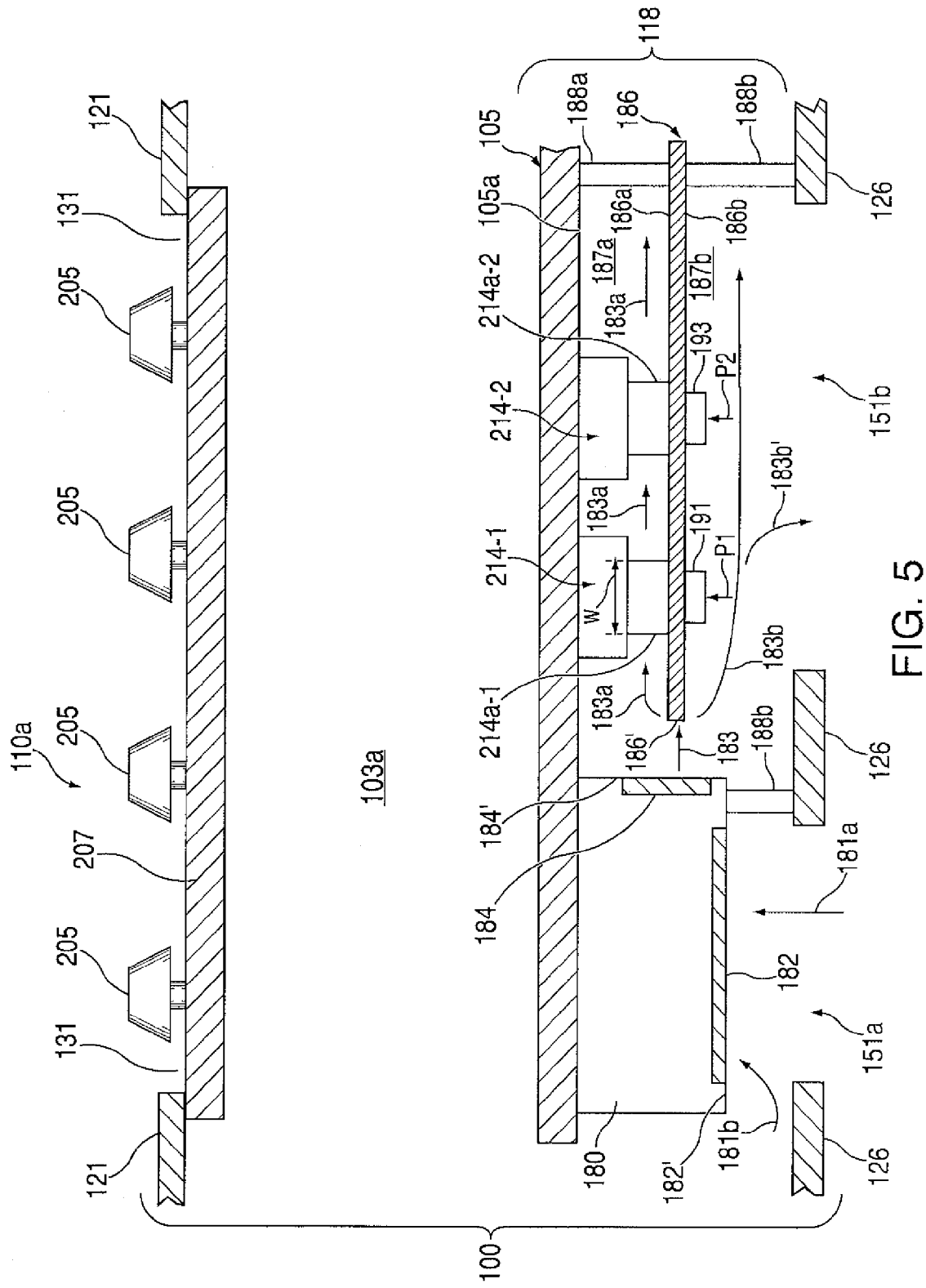
FIG. 5 shows a partial cross-sectional view of a portion of the electronic device of FIGS. 1-4, taken from line V-V of FIG. 2, according to some embodiments of the invention.

Base housing component 101a may include a top wall 121, various side walls, such as front wall 122, back wall 123, right wall 124, and left wall 125, and a bottom wall 126 opposite top wall 121. In some embodiments, one or more openings may be provided through one or more of the walls of housing component 101a to at least partially expose one or more components of electronic device 100. For example, as shown in FIGS. 2 and 4, an opening 131 may be provided through top wall 121 of base housing component 101a to at least partially expose an input component 110a of electronic device 100. In some embodiments, as shown in FIGS. 2 and 4, for example, openings 141a and 141b may be provided through top wall 121 of base housing component 101a to at least partially expose respective output components 112a and 112b of electronic device 100. Moreover, as shown in FIGS. 3-5, openings 151a and 151b may be provided through bottom wall 126 of base housing component 101a and openings 151c and 151d may be provided through back wall 123 of base housing component 101a. These openings may be used to allow fluids (e.g., air) to enter and exit housing 101 for cooling device 100, for example, in conjunction with one or more cooling modules 118.

Likewise, display housing component 101b may include a top wall 161, various side walls, such as front wall 162, back wall 163, right wall 164, and left wall 165, and a bottom wall (not shown) opposite top wall 161. In some embodiments, one or more openings may be provided through one or more of the walls of housing component 101b to at least partially expose one or more components of electronic device 100. For example, as shown in FIG. 2, an opening 171 may be provided through top wall 161 of display housing component 101b to at least partially expose an output component 112c of electronic device 100.

Input component 110a is illustrated in FIGS. 2 and 5 to be a keyboard assembly including one or more keys 205 coupled to keyboard circuitry 207, although it is to be understood that input component 110a exposed by opening 131 through top wall 121 of housing component 101a may be any type of input component as described herein in accordance with the invention. Moreover, although output components 112a and 112b are illustrated in FIG. 2 to be audio speakers, it is to be understood that each one of output components 112a and 112b exposed by a respective opening 141 through top wall 121 of housing component 101a may be any type of output component as described herein in accordance with the invention. Similarly, although output component 112c is illustrated in FIG. 2 to be a visual display, it is to be understood that output component 112c exposed by opening 171 through top wall 161 of housing component 101b also may be any type of output component as described herein in accordance with the invention.

As shown in FIGS. 4 and 5, a cooling module 118 may be positioned within cavity 103a of base housing component 101a adjacent one or more heat-generating components 214 of electronic device 100. Cooling module 118 may help dissipate heat away from at least one heat-generating component 214 for cooling electronic device 100. Each heat-generating component 214 may be any component of electronic device 100 capable of generating heat (e.g., a chipset of motherboard 105, processor 102, power supply 106, etc.). Each heat-generating component 214 may include an external heat-generating surface portion 214a. Heat-generating components 214 may be configured to spread or otherwise generate heat at external surface portion 214a, thereby increasing the temperature of external surface portion 214a. The temperature of heat-generating component 214 may vary along width W of external surface portion 214a, thereby creating one or more hotspots.

Cooling module 118 may include one or more airflow generators 180. Each airflow generator 180 may be a fan or any other device capable of generating an outflow of air for cooling portions of electronic device 100 (e.g., one or more heat-generating components 214). Although the terms "air," "airflow," and the like are used to describe aspects of the invention, it is to be understood that various other suitable fluids other than air may be used by cooling modules 118 to dissipate heat generated by components of electronic device 100.

Airflow generator 180 may include at least one inlet 182 for drawing in or otherwise receiving an inflow of air that may be used by generator 180 to cool device 100. For example, as shown in FIGS. 4 and 5, inlet 182 may be positioned along a first portion 182' of generator 180. First portion 182' of generator 180 may be proximate opening 151a through bottom wall 126 of base housing component 101a, such that an inflow of air 181a may be drawn from outside of device 100, through housing opening 151a, and into inlet 182 of airflow generator 180. Additionally or alternatively, an inflow of air 181b may be drawn from within cavity 103a of base housing component 101a and into inlet 182 of airflow generator 180. Although not shown, an additional inflow of air may be drawn into an inlet of generator 180 from outside of device 100, through housing opening 151c in back wall 123 of base housing component 101a, for example.

Airflow generator 180 may also include at least one outlet 184 for blowing or otherwise discharging an outflow of air 183 that may be used by cooling module 118 to cool device 100. For example, as shown in FIGS. 4 and 5, outlet 184 may be positioned along a second portion 184' of generator 180. Second portion 184' may be a side of generator 180 that runs perpendicular to and/or that intersects first portion 182' of generator 180. Generator 180 may include any circuitry and/or mechanical components capable of receiving one or more air inflows (e.g., air inflow 181a and/or air inflow 181b) and producing one or more air outflows 183. In some embodiments, generator 180 may redirect the direction of the airflow between an air inflow (e.g., air inflow 181a and/or air inflow 181b) and outflow 183. Additionally or alternatively, generator 180 may increase or decrease the velocity of the airflow between an air inflow (e.g., air inflow 181a and/or air inflow 181b) and outflow 183. Furthermore, in some embodiments, generator 180 may additionally or alternatively increase or decrease the temperature of the airflow between an air inflow (e.g., air inflow 181a and/or air inflow 181b) and outflow 183.

Cooling module 118 may also include at least one divider 186. Divider 186 may be a wall or any other suitable component positioned adjacent airflow generator 180 for splitting air outflow 183 discharged from outlet 184 into two or more various outflow portions. For example, divider 186 may be configured to split air outflow 183 into a first outflow portion 183a and a second outflow portion 183b. As shown, divider 186 may include at least a first surface 186a and a second surface 186b. Divider 186 may be configured to split air outflow 183 such that first outflow portion 183a may be directed to flow along first divider surface 186a and such that second outflow portion 183b may be directed to flow along second divider surface 186b.

In some embodiments, divider 186 may be shaped (e.g., at an edge 186' between first surface 186a and second surface 186b) such that outflow 183 may be easily split into at least first outflow portion 183a and second outflow portion 183b. Additionally or alternatively, it is to be understood that generator 180 may include two or more distinct outlets 184 for discharging its own respective air outflow 183. In such embodiments, a divider (e.g., divider 186) may be provided such that the various airflows 183 of generator 180 may remain distinct as they flow further away from their respective outlets 184.

Outlet 184 of generator 180 may be positioned with respect to divider 186 within housing cavity 103a such that first outflow portion 183a may be directed to flow between first divider surface 186a and at least one heat-generating component 214. In some embodiments, heat-generating component 214 may be coupled to motherboard or circuit board 105 of electronic device 100. For example, as shown, each one of heat-generating components 214-1 and 214-2 may be coupled to circuit board 105 and may extend away from a first surface 105a of circuit board 105. In such embodiments, first outflow portion 183a may be directed to flow not only between first divider surface 186a and first circuit board surface 105a, but also about at least a portion of heat-generating component 214-1 and heat-generating component 214-2. Therefore, the air of first outflow portion 183a may help cool or otherwise dissipate heat generated by one or more heat-generating components 214. Likewise, the air of first outflow portion 183a may help cool or otherwise dissipate heat away from first divider surface 186a.

Moreover, an opening 151 of housing 101 (see, e.g., FIG. 4 and opening 151d in back wall 123 of base housing component 101a) may be at least partially exposed to the path of first outflow portion 183a such that at least some of the air of first outflow portion 183a may flow out of electronic device 100. For example, once it passes one or more heat-generating components 214, at least some of the air of first outflow portion 183a may flow out of electronic device 100 through housing opening 151d. Therefore, air (e.g., airflow warmed by dissipating heat from one or more heat-generating components 214 and/or first divider surface 186a) may be discharged from base housing 101a through a housing opening 151 for cooling electronic device 100.

Outlet 184 of generator 180 may be positioned with respect to divider 186 within housing cavity 103a such that second outflow portion 183b may be directed to flow between second divider surface 186b and at least one other surface or component of electronic device 100. For example, second outflow portion 183b may be directed to flow between second divider surface 186b and bottom wall 126 of base housing component 101a. In such embodiments, the air of second outflow portion 183b may help cool or otherwise dissipate heat away from second divider surface 186b and/or bottom wall 126.

Moreover, an opening 151 of housing 101 (e.g., opening 151b in bottom wall 126 of base housing component 101a) may be at least partially exposed to the path of second outflow portion 183b such that at least some of the air of second outflow portion 183b (e.g., the air of second outflow subportion 183b' of FIGS. 4 and 5) may flow out of electronic device 100. For example, once it passes between at least a portion of second divider surface 186b and bottom wall 126, at least some of the air of second outflow portion 183b (e.g., the air of second outflow subportion 183b' of FIGS. 4 and 5) may flow out of electronic device 100 through housing opening 151b. Therefore, air (e.g., airflow warmed by dissipating heat away from second divider surface 186b and/or bottom wall 126) may be discharged from base housing 101a through a housing opening 151 for cooling electronic device 100.

In some embodiments, cooling module 118 may include one or more barriers 188 for limiting the space through which one or more portions of an air inflow (e.g., air inflow 181a and/or air inflow 181b) and/or air outflow 183 may travel within electronic device 100. For example, a first barrier 188a may be provided between portions of first circuit board surface 105a and portions of first divider surface 186a for at least partially defining a first chamber 187a through which first air outflow portion 183a may flow. Additionally or alternatively, a second barrier 188b may be provided between portions of bottom wall 126 and portions of second divider surface 186b for at least partially defining a second chamber 187b through which second air outflow portion 183b may flow. Each barrier 188 may be made of any suitable material, such as foam, for defining an airflow chamber (e.g., first chamber 187a and/or second chamber 187b).

Cooling module 118 may also include at least one pressure clip 190. Pressure clip 190 may be any suitable component that may be configured to exert a pressure on a portion of second divider surface 186b of divider 186 such that the pressure may hold a portion of first divider surface 186a in contact (e.g., physical and/or thermal contact) with a portion of a heat-generating component 214. For example, pressure clip 190 may include at least a first pressure clip end portion 191 configured to exert a first pressure in the direction of arrow P1 on a first portion of second divider surface 186b, such that the first pressure may force a first portion of first divider surface 186a to remain in contact with a portion of first heat-generating component 214-1 (e.g., in contact with first external heat-generating surface portion 214a-1). In some embodiments, pressure clip 190 may also include at least a second pressure clip end portion 193 configured to exert a second pressure in the direction of arrow P2 on a second portion of second divider surface 186b, such that the second pressure may force a second portion of first divider surface 186a to remain in contact with a portion of second heat-generating component 214-2 (e.g., in contact with second external heat-generating surface portion 214a-2). Moreover, first pressure clip end portion 191 and second pressure clip end portion 193 may both be coupled to a single pressure clip anchor portion 192.

Figure 6A:
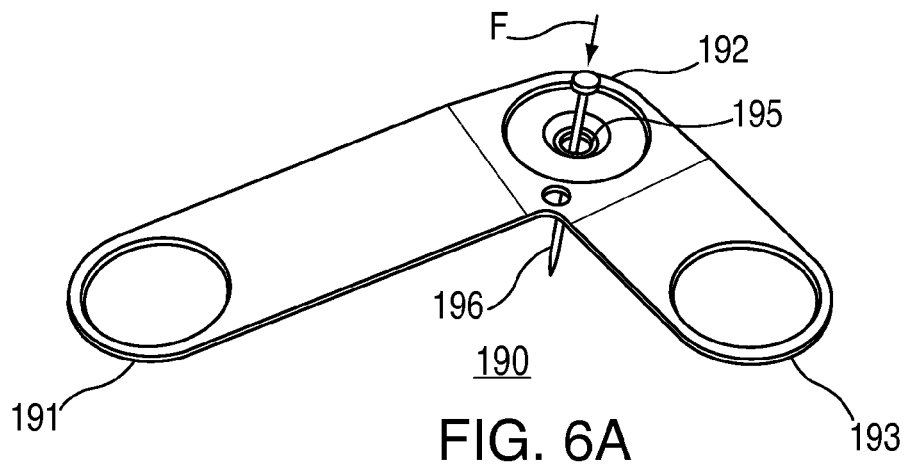
FIG. 6A shows a bottom, rear, right perspective view of a portion of the electronic device of FIGS. 1-5, according to some embodiments of the invention.
Figure 6B:
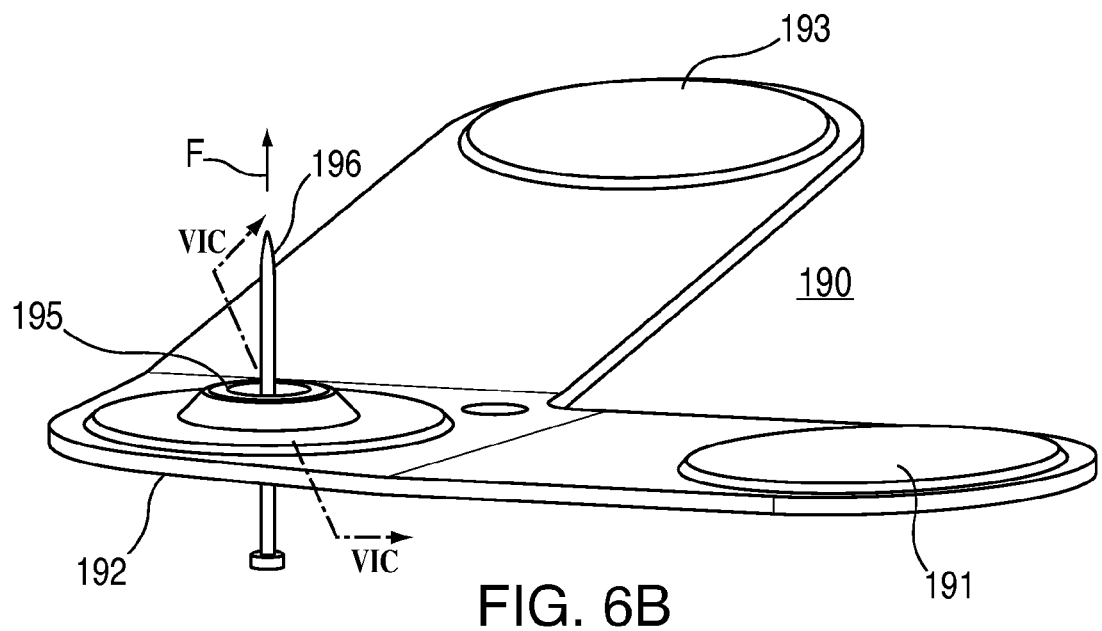
FIG. 6B shows a top, rear, left perspective view of a portion of the electronic device of FIGS. 1-6A, according to some embodiments of the invention.
Figure 6C:
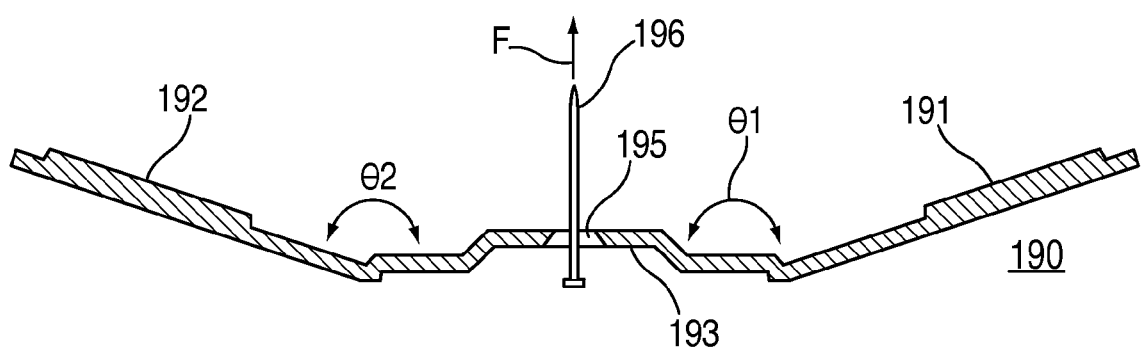
FIG. 6C shows a partial cross-sectional view of a portion of the electronic device of FIGS. 1-6B, taken from line VIC-VIC of FIG. 6B, according to some embodiments of the invention.

Pressure clip 190 may be a spring loaded flexure or any other suitable component that may be deformable into a second configuration other than its original non-deformed configuration. For example, as shown in FIGS. 6A-6C, pressure clip 190 may have an original configuration such that first pressure clip end portion 191 extends away from pressure clip anchor portion 192 at an angle θ1. A fastener 196 (e.g., a screw) may be provided to extend in a direction F, from a portion of anchor portion 192 (e.g., through hole 195), through divider 186 (e.g., through second divider surface 186b and then through first divider surface 186a), and then to a portion of a heat-generating component 214 or circuit board 105 (e.g., to a fastener clamp 197 of FIG. 4).

When fastener 196 extends from anchor portion 192, to circuit board 105, through divider 186, pressure clip 190 may be forced to deform such that first pressure clip end portion 191 may lie in the same plane as anchor portion 192 (e.g., angle θ1 may increase, for example, to 180°). This deformed configuration may cause first pressure clip end portion 191 to exert a force in the direction of arrow P1 on divider 186. Similarly, if pressure clip 190 also includes second pressure clip end portion 193 that extends away from anchor portion 193 at an angle θ2 in its original configuration, pressure clip 190 may be forced to deform such that second pressure clip end portion 193 may lie in the same plane as anchor portion 192 (e.g., angle θ2 may increase, for example, to 180°). For a larger angle θ in the original configuration of pressure clip 190, a greater pressure may be exerted on divider 186 by pressure clip 190 when deformed. In some embodiments, the pressure that may be exerted by each pressure clip end portion may be in the range of 100 to 250 pounds per square inch ("PSI"), for example.

In some embodiments, divider 186 may be at least partially made of any suitable material that can conduct or otherwise transmit heat along its length (e.g., along one or both of divider surfaces 186a and 186b extending from edge 186' away from airflow generator 180). Additionally or alternatively, divider 186 may be at least partially made of any suitable material that can insulate or otherwise reduce the transfer of heat along its thickness (e.g., between divider surfaces 186a and 186b). For example, divider 186 may be at least partially made of graphite. The graphite or other suitable material may be laminated with a protective covering (e.g., an aluminum laminate). Therefore, divider 186 may be a hybrid heat spreader/insulator that may be positioned to create bifurcate airflow within an electronic device. One or more holes or gaps may be provided in the protective covering of divider 186 at the one or more portions along first divider surface 186a that may contact heat-generating components 214 (e.g., due to the force exerted by pressure clip 190 on divider 186). When in thermal contact with a portion of a heat-generating component 214 (e.g., a chip set or processor of motherboard 105), divider 186 may be configured to receive heat generated by the heat-generating component and to transfer the received heat away from the heat-generating component for cooling electronic device 100.

One or more thermoelectric cooling components (not shown) can be provided to create a temperature difference between the junction of first divider surface 186a and an external heat-generating surface portion 214a (e.g., at one or more hotspots) for helping to dissipate heat generated by the heat-generating component 214, such as the thermoelectric cooling components described in Ali, U.S. Published Patent Application No. 2008/0101038, published May 1, 2008, entitled "Embedded Thermal-Electric Cooling Modules For Surface Spreading Of Heat," which is incorporated by reference herein in its entirety. Each thermoelectric cooling component may be any component or components suitable to move heat from one surface or material to another surface or material. For example, each thermoelectric cooling component may take various forms, including, but not limited to, any solid-state cooling mechanism that uses the Peltier effect, such as a Peltier cooler, Peltier diode, Peltier heat pump, solid state refrigerator, thermoelectric cooler ("TEC"), or any other component that may transfer heat from one material to another material with the consumption of electrical energy, and any combinations thereof. A thermoelectric cooling component provided as a TEC, for example, may include one or more p/n junctions (e.g., 1, 4, or 16 p/n junctions) in a semiconductor device and may be powered by providing a current from a power supply (e.g., power supply 106 of electronic device 100).

While there have been described systems and methods for cooling an electronic device using airflow dividers, it is to be understood that many changes may be made therein without departing from the spirit and scope of the invention. It is also to be understood that various directional and orientational terms such as "front" and "back" and "rear," "left" and "right," "top" and "bottom," and the like are used herein only for convenience, and that no fixed or absolute directional or orientational limitations are intended by the use of these words. For example, the devices of the invention can have any desired orientation. If reoriented, different directional or orientational terms may need to be used in their description, but that will not alter their fundamental nature as within the scope and spirit of the invention. Those skilled in the art will appreciate that the invention can be practiced by other than the described embodiments, which are presented for purposes of illustration rather than of limitation, and the invention is limited only by the claims which follow.

What is claimed is:

1. An electronic device comprising:
   a pressure clip;
   a heat-generating component;
   a fan configured to produce an outflow of air; and
   a divider, wherein the divider is configured to direct a first portion of the outflow of air to flow along a first surface of the divider and about the heat-generating component, wherein the divider is configured to direct a second portion of the outflow of air to flow along a second surface of the divider, wherein a first portion of the pressure clip is configured to exert a first pressure on a first portion of the second surface of the divider, and wherein the first pressure is configured to hold a first portion of the first surface of the divider in contact with the heat-generating component.

2. The electronic device of claim 1 further comprising a wall, wherein the divider is configured to direct the second portion of the outflow of air to flow between the second surface of the divider and the wall.

3. The electronic device of claim 2 further comprising:
a circuit board coupled to the heat-generating component;
a first barrier extending between the first surface of the divider and the circuit board for creating a first chamber for the first portion of the outflow of air; and
a second barrier extending between the second surface of the divider and the wall for creating a second chamber for the second portion of the outflow of air.

4. The electronic device of claim 1 further comprising a second heat-generating component, wherein a second portion of the pressure clip is configured to exert a second pressure on a second portion of the second surface of the divider, and wherein the second pressure is configured to hold a second portion of the first surface of the divider in contact with the second heat-generating component.

5. The electronic device of claim 4, wherein the pressure clip comprises an anchor portion, wherein the first portion of the pressure clip extends away from the anchor portion, and wherein the second portion of the pressure clip extends away from the anchor portion.

6. The electronic device of claim 5, wherein the first portion of the pressure clip is a first free end portion of the pressure clip, and wherein the second portion of the pressure clip is a second free end portion of the pressure clip.

7. The electronic device of claim 6 further comprising a fastener extending from the anchor portion to the divider for holding together the pressure clip and the divider.

8. The electronic device of claim 1 further comprising:
a circuit board coupled to the heat-generating component; and
a fastener extending from the pressure clip, through the divider, and to the circuit board for holding together the pressure clip, the divider, and the circuit board.

9. The electronic device of claim 1, wherein the pressure clip is a spring loaded flexure.

10. The electronic device of claim 1, wherein the divider conducts heat along at least one of the first and second surfaces of the divider, and wherein the divider insulates heat between the first and second surfaces of the divider.

11. The electronic device of claim 1, wherein the divider comprises graphite.

12. The electronic device of claim 11, wherein at least one of the first and second surfaces of the divider comprises aluminum coupled to the graphite.

13. The electronic device of claim 1 further comprising a housing component having at least a first wall, wherein the divider is configured to direct the second portion of the outflow of air to flow between the second surface of the divider and the first wall.

14. The electronic device of claim 1 further comprising a circuit board, wherein the heat-generating component is coupled to a first surface of the circuit board, and wherein the divider is configured to direct the first portion of the outflow of air to flow between the first surface of the divider and the first surface of the circuit board.

15. The electronic device of claim 1, wherein the first portion of the pressure clip is a first free end portion of the pressure clip.

16. The electronic device of claim 1 further comprising a fastener extending from the pressure clip to the divider for holding together the pressure clip and the divider.

17. A method of cooling an electronic device including a heat-generating component and a divider having a first surface and a second surface, the method comprising:
exerting a pressure on a portion of the second surface of the divider, wherein the pressure is configured to hold a portion of the first surface of the divider in contact with the heat-generating component;
directing a first portion of an outflow of air from a fan along the first surface of the divider and about the heat-generating component; and
directing a second portion of the outflow of air from the fan along the second surface of the divider.

* * * * *